United States Patent [19]

Buzak

[11] Patent Number: 5,272,472
[45] Date of Patent: Dec. 21, 1993

[54] APPARATUS FOR ADDRESSING DATA STORAGE ELEMENTS WITH AN IONIZABLE GAS EXCITED BY AN AC ENERGY SOURCE

[75] Inventor: Thomas S. Buzak, Aloha, Oreg.

[73] Assignee: Tektronix, Inc., Wilsonville, Oreg.

[21] Appl. No.: 793,987

[22] Filed: Nov. 18, 1991

Related U.S. Application Data

[63] Continuation-in-part of Ser. No. 434,634, Dec. 13, 1989, Pat. No. 5,077,553, Continuation of Ser. No. 145,061, Jan. 19, 1988, abandoned.

[51] Int. Cl.$^5$ .............................................. G09G 3/00
[52] U.S. Cl. ......................................... 345/60; 315/116
[58] Field of Search ............... 340/716, 718, 719, 765, 340/767, 768, 769, 771, 773, 775, 779, 784, 793, 794; 365/106, 108, 116; 315/169.4

[56] References Cited

U.S. PATENT DOCUMENTS

| | | | |
|---|---|---|---|
| 3,262,010 | 7/1966 | Kazan | 315/63 |
| 3,972,040 | 7/1976 | Hilsum et al. | 340/324 M |
| 4,027,195 | 5/1977 | Shutoh et al. | 315/169 |
| 4,319,239 | 3/1982 | Stephens | 340/784 |
| 4,322,659 | 3/1982 | De Jule et al. | 315/169.1 |
| 4,339,482 | 7/1982 | Glaser et al. | 428/13 |
| 4,342,993 | 8/1982 | Holz | 340/779 |
| 4,352,101 | 9/1982 | De Jule | 340/769 |
| 4,391,492 | 7/1983 | Lu et al. | 350/351 |
| 4,395,244 | 7/1983 | Glaser | 445/25 |
| 4,550,039 | 10/1985 | Glaser et al. | 428/13 |
| 4,771,183 | 9/1988 | McGlynn | 250/578 |
| 4,864,538 | 9/1989 | Buzak | 340/799 |
| 4,896,149 | 1/1990 | Buzak et al. | 340/794 |
| 5,036,317 | 7/1991 | Buzak | 340/799 |
| 5,077,553 | 12/1991 | Buzak | 340/794 |

FOREIGN PATENT DOCUMENTS 2162984 2/1986 United Kingdom.

OTHER PUBLICATIONS

Scheffer, Terry J., "Direct-Multiplexed Liquid-Crystal Displays", Seminar 4, SID 1987, 4.2-4.34.
Howard, W. E., "Active-Matrix Techniques for Displays", *Proceedings* of the SID, vol. 27/4, 1986, 313-326.
Firester, Arthur H., "Active Matrics for Liquid-Crystal Displays", Seminar 5, SID 1987, 5.2-5.25.
Malmberg, Paul R., "Active Matrix Addressing Technology", Seminar 3, SID 1985, 3.2-2-3.2-28.
Dick, George W., "Plasma Display Panel Techniques", Seminar 2, SID 1985, 2.2-2-2.2-54.
Mikoshiba, Shigeo, "Plasma Displays", *Seminar 10, SID 1987*, 10.2-10.37.
Szydlo, N., et al., "Integrated Matrix-Addressed LCD Using Amorphous-Silicon Back-to-Back Diodes", Proceedings of the SID, vol. 25/4, 1984, 265-268.

*Primary Examiner*—Jeffery Brier
*Attorney, Agent, or Firm*—John D. Winkelman; Paul S. Angello

[57] ABSTRACT

An apparatus for addressing data storage elements (16) uses an ionizable gas excited by an AC energy source to store an analog datum in and read an analog datum out of each of the storage elements. The storage elements are defined by the overlapping areas of multiple column electrodes (18) extending in a common direction on a first substrate (48) and multiple channels (20) extending in a common direction on a second substrate (54). A layer of dielectric material (46) separates the first and the second substrates, which are positioned face-to-face and spaced-apart with the direction of the channels transverse to that of the column electrodes. Each of the channels is filled with an ionizable gas and includes two row electrodes electrically isolated from each other. At least one of the row electrodes is isolated from the gas by a dielectric coating (65) to prevent nonuniform current flow in certain regions along the length of a channel. The ionizable gas functions as an electrical switch that changes between a conducting or plasma state and a nonconducting or nonionized state in response to phase-displaced AC pulse signals to selectively address and apply analog data to the storage elements.

7 Claims, 7 Drawing Sheets

APPARATUS FOR ADDRESSING DATA STORAGE ELEMENTS WITH AN IONIZABLE GAS EXCITED BY AN AC ENERGY SOURCE

RELATED APPLICATIONS

This is a continuation-in-part of application Ser. No. 07/434,634, filed Nov. 13, 1989, now U.S. Pat. No. 5,077,553 which is a continuation of application Ser. No. 07/145,061, filed Jan. 19, 1988, abandoned.

TECHNICAL FIELD

The present invention relates to systems constructed of data storage elements and, in particular, to apparatus for addressing an array of such storage elements with the use of an ionizable gas excited by an AC energy source.

BACKGROUND OF THE INVENTION

Systems employing data storage elements include, for example, video cameras and image displays. Such systems employ an addressing structure that provides data to or retrieves data from the storage elements. One system of this type to which one embodiment of the present invention is particularly directed is a general purpose flat panel display, whose storage or display elements store light pattern data. A flat panel display comprises multiple display elements distributed throughout the viewing area of a display surface. A flat panel display system is desirable because it does not necessarily require a cathode-ray tube to develop a display image. A cathode-ray tube is undesirable because of its size, fragility, and need for high voltage drive circuitry.

One type of flat panel display system employs an addressing structure that accomplishes direct multiplexing of multiple liquid crystal cells or display elements arranged in an array. Each of the liquid crystal cells is positioned between a pair of electrical conductors that selectively apply select and deselect voltage signals across the liquid crystal cell to change its optical properties and thereby change the brightness of the image it develops. A display system of this type is characterized as "passive" because no "active" electronic device cooperates with the liquid crystal cell to modify its electro-optical properties. Such a display system suffers from the disadvantage of being capable of implementation with only a limited number of addressable lines (i.e., up to about 250) of video information or data for developing a display image.

One expedient for increasing the number of addressable lines of data in a liquid crystal display system entails the use of an addressing structure in which a separate electronic device cooperates with each liquid crystal cell to increase the effective nonlinearity of its electro-optic response to the select and deselect voltage signals. Some of what are referred to as "two-terminal" device addressing techniques can be characterized in this way. Although increasing the effective nonlinearity of a display element may allow greater multiplexing capabilities in a bilevel display, there remain many difficulties with this technique in respect to achieving gray scale performance.

The objective in designing liquid crystal matrix display systems having full gray scale capability is to provide an addressing structure that does not rely on obtaining the nonlinearity function from the liquid crystal material. An addressing structure that uses a matrix of electrically "active" elements accomplishes this objective by employing at each picture element an electronic switch that is separate from the liquid crystal material. The active matrix uses two- or three-terminal solid state devices in association with each liquid crystal cell to develop the needed nonlinearity and display element isolation. Addressing structures constructed of two-terminal devices can employ diodes of various types, and addressing structures constructed of three-terminal devices can employ thin film transistors (TFT) of various types manufactured from different semiconductor materials.

One problem with two- and three-terminal active matrices is that the very large number of active devices makes it very difficult to fabricate the matrix in large quantities with high production yields. Another problem, which is characteristic of TFT devices, is the difficulty of constructing thin film transistors with sufficiently high "off resistances." A relatively low "off resistance" provides a display element that may not hold the charge developed across it for the requisite time. A relatively low "off resistance" also decreases the "off resistance" to "on resistance" ratio, which preferably exceeds $10^6$ to promote proper operation of the TFT matrix. TFT matrices sometimes employ a separate storage capacitor with each display element to offset the effect of an insufficiently high "off resistance." The use of separate storage capacitors increases, however, the complexity of the TFT matrix incorporating them and the likelihood of decreased production yields. One other possible problem with a TFT active matrix is that the size of a TFT can be relatively large compared to that of the display element because "on" current requirements tend to increase the dimensions of a TFT device. This may affect the light efficiency of the device.

An active matrix formed of TFT devices is capable of developing black-and-white and colored images. To develop colored images, the active matrix employs a color filter containing multiple groups of spots in different colors spatially aligned with the display elements. A group of display elements aligned with spots of different colors would, therefore, define a single image pixel.

Flat panel display systems can also be implemented with display elements employing an ionizable gas or plasma that glows to produce on a display surface luminous regions whose color is characteristic of the type of gas used. The luminous regions are selectively activated to form a display image.

Another type of flat panel display system employs a plasma to generate electrons that are accelerated to strike a phosphor and produce a luminescent spot. Such a flat panel display provides increased efficiency in brightness but is difficult to produce with large display areas and requires complex drive circuits. Such flat panel displays can be constructed with multiple electron-excited phosphors having different spectral characteristics to provide multi-colored images.

Problems with gas-plasma flat panel displays are purportedly alleviated through the use of gas-discharge displays of the plasma-sac type. In such displays, a plasma-sac produced on the cathode side of an aperture insulator moves from one aperture to another to effect a raster-type scan. The plasma-sac-type gas-discharge displays are also complex to fabricate and are susceptible to low production yields.

U.S. Pat. No. 4,896,149 of Buzak et al., which is assigned to the assignee of the present patent application, describes an addressing structure using an ionizable gaseous medium to address data storage elements defined by overlapping areas of multiple column electrodes on a first substrate and multiple channels on a second substrate. A layer of dielectric material separates the first and second substrates. Each of the channels includes a reference electrode and a row electrode. The reference electrode is set at ground potential, and the row electrode receives negative-going DC pulse signals to selectively effect ionization of the gas contained within the channels.

SUMMARY OF THE INVENTION

An object of the present invention is, therefore, to provide a system employing data elements implemented as part of an addressing structure that can be produced at low cost with high production yields.

Another object of this invention is to provide a method that employs an ionizable gaseous medium to address a data storage element so that data can be read into or retrieved from it.

A further object of this invention is to provide a flat panel display system with high-speed addressing capabilities and high contrast characteristics and having storage or display elements comprised of an electro-optic material and an active addressing structure.

Still another object of this invention is to provide such a display system in which an electro-optic material cooperates with an ionizable gas to form addressable data storage elements.

Yet another object of this invention is to provide such a display system that has good color, gray scale, and brightness characteristics.

The present invention relates to an apparatus for addressing data elements with the use of an ionizable gas excited by an AC energy source. The invention comprises an addressing structure implemented in a high resolution flat panel display system that can be used in either direct view or projection applications. The display system includes a display panel having a display surface formed of an array of data storage or display elements distributed throughout the viewing area thereof. Each of the display elements comprises a localized volume of ionizable gas, such as helium, and an electro-optic material, such as a nematic liquid crystal, that cooperates to modulate externally generated light propagating through the region of the electro-optic material where the display element is located.

The storage elements are arranged in columns and rows. A row represents one line of video information or data. (The information addressed is hereafter referred to as "data.") The columns receive the data, and a data strobe circuit addresses the columns row by row in a row scan fashion.

A preferred embodiment of the display panel comprises first and second spaced-apart substrates positioned face-to-face to each other. Multiple nonoverlapping electrical conductors extending generally in a first direction along the inner surface of the first substrate form column electrodes for data drive signals applied to them. Multiple nonoverlapping channels inscribed into the inner surface of the second substrate extend along the inner surface in a direction generally transverse to the first direction. The first and second directions preferably align with the vertical and horizontal directions, respectively. Two row electrodes, at least one of which is coated with a layer of dielectric material, are electrically isolated from each other extend along the length of the interior of each channel and receive negative-going, phase-displaced data strobe voltage signals applied between them. Each of the channels is filled with the ionizable gas.

In the display panel of the first embodiment, a layer of material having electro-optical properties and a layer of dielectric material are positioned between the inner surfaces of the first and second substrates, the layer of dielectric material covering the channels to form a barrier between the layer of the electro-optic material and the ionizable gas. The display elements are defined by the overlapping areas of the column electrodes and the channels and appear as spots on the display screen. The spots preferably are sufficiently small and positioned close to one another so that they are indistinguishable by an observer during normal viewing conditions.

The display panel is configured as described above so that for each display element, the ionizable gas functions as an electrical switch that changes between a conducting or plasma state and a nonconducting or nonionized state in response to an applied data strobe signal. The magnitude of the data drive signal on the column electrodes corresponds to the luminance of a display image.

Whenever it is in the conducting state, a region of ionized gas allows a data voltage of a magnitude representing that of a data drive signal to develop across the liquid crystal material in a region spatially aligned with the region of ionized gas. Whenever it changes to the nonconducting state, the region of nonionized gas allows the spatially aligned region of liquid crystal material to hold the data voltage across it for a time. The ionizable gas functions, therefore, to select and store data across the liquid crystal material and thereby provide a display system having gray scale capability.

Switching the ionizable gas between the conducting state and the nonconducting state in the display panel modulates the light transmission through a display element. The modulation of light transmission depends on the magnitude of the applied data drive signal. A monochrome or black-and-white display system with gray scale luminance qualities can be implemented with the use of the display panel. A full color display system with controllable color intensity can be implemented by positioning within the black-and-white display system a color filter containing groups of spots in three primary colors spatially aligned with the display elements. A group of three display elements spatially aligned with a group of spots would, therefore, represent one image pixel whose color is determined by the relative intensities of the spots in the group.

Driving row electrodes configured such that at least one of which is isolated from the gas by a dielectric coating prevents "current hogging" in certain regions along the length of a channel and thereby promotes a uniform glow of ionizable gas.

The display system of the present invention is capable of rendering fully dynamic, gray scale images over a broad range of field rates to provide a quality display. The display system is especially advantageous because it is of simple, rugged construction and is capable of addressing at least 3,000 lines of data at 60 Hz field rates on the display screen.

Additional objects and advantages of the present invention will be apparent from the detailed description of a preferred embodiment thereof, which proceeds with reference to the accompanying drawings.

DETAILED DESCRIPTION OF PREFERRED EMBODIMENT

Figure 1:
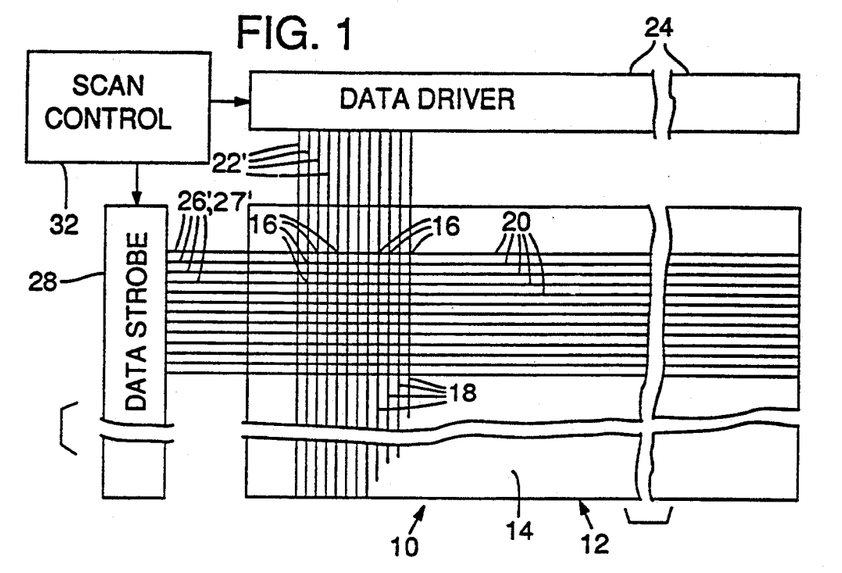
FIG. 1 is a diagram showing a frontal view of the display surface of a display panel and associated drive circuitry of a display system embodying the present invention.

FIG. 1 shows a flat panel display system 10 that implements the addressing structure and carries out the addressing method of the present invention. With reference to FIG. 1, flat panel display system 10 comprises a display panel 12 having a display surface 14 that contains a pattern formed by a rectangular planar array of nominally identical data storage or display elements 16 mutually spaced apart by predetermined distances in the vertical and horizontal directions. Each display element 16 in the array represents the overlapping portions of thin, narrow electrodes 18 arranged in vertical columns and elongate, narrow channels 20 arranged in horizontal rows. (The electrodes 18 are hereinafter referred to as "column electrodes 18.") The display elements 16 in each of the rows of channels 20 represent one line of data.

The widths of column electrodes 18 and channels 20 determine the dimensions of display elements 16, which are of rectangular shape. Column electrodes 18 are deposited on a major surface of a first electrically nonconductive, optically transparent substrate, and channels 20 are inscribed in a major surface of a second electrically nonconductive, optically transparent substrate, as will be further described below. Skilled persons will appreciate that certain systems, such as a reflective display of either the direct view or projection type, would require that only one of the substrates be optically transparent.

Column electrodes 18 receive data drive signals of the analog voltage type developed on parallel output conductors 22' by different ones of the output amplifiers 22 (FIGS. 2-6) of a data driver or drive means or drive circuit 24, and channels 20 preferably receive phase-displaced data strobe signals of the AC voltage pulse type developed on parallel pairs of output conductors 26' and 27' by different respective ones of the output amplifiers 26 and 27 (FIGS. 2-6) of a data strobe or strobe means or strobe circuit 28. The output conductors 26' and 27' are connected to respective row electrodes 62 and 30 placed within channels 20, as is described below. (The electrodes 30 and 62 are hereinafter referred to as "row electrodes 30 and 62.") It may be desirable to employ known techniques, such as multiplexing, to reduce the number of output amplifiers 26 and 27. Certain multiplexing techniques for reducing the number of row electrode drivers are described in the aforementioned U.S. Pat. No. 4,896,149.

To synthesize an image on the entire area of display surface 14, display system 10 employs a scan control circuit 32 that coordinates the functions of its data driver 24 and data strobe 28 so that all columns of display elements 16 of display panel 12 are addressed row by row in row scan fashion. Display panel 12 may employ electro-optic materials of different types. For example, if it uses such a material that changes the polarization state of incident light rays 33, display panel 12 is positioned between a pair of light polarizing filters 34 and 36 (FIG. 2), which cooperate with display panel 12 to change the luminance of light propagating through them. The use of a scattering liquid crystal cell as the electro-optic material would not require the use of polarizing filters 34 and 36, however. A color filter (not shown) may be positioned within display panel 12 to develop multi-colored images of controllable color intensity. For a projection display, color can also be achieved by using three separate monochrome panels 10, each of which controls one primary color.

With reference to FIGS. 2-5, display panel 12 comprises an addressing structure that includes a pair of generally parallel electrode structures 40 and 42 spaced apart by a layer 44 of electro-optic material, such as a nematic liquid crystal, and a thin layer 46 of a dielectric material, such as glass, mica, or plastic. Electrode structure 40 comprises a glass dielectric substrate 48 that has deposited on its inner surface 50 column electrodes 18 of indium tin oxide, which is optically transparent, to form a striped pattern. Adjacent pairs of column electrodes 18 are spaced apart a distance 52, which defines the horizontal space between next adjacent display elements 16 in a row.

Electrode structure 42 comprises a glass dielectric substrate 54 into whose inner surface 56 multiple channels 20 of trapezoidal cross section are inscribed. Channels 20 have a depth 58 measured from inner surface 56 to a base portion 60. Each one of the channels 20 has a pair of thin, narrow nickel electrodes 30 and 62 extending along base portion 60 and a pair of inner side walls 64 diverging in the direction away from base portion 60 toward inner surface 56. At least one of the row electrodes 30 and 62 is covered by a thin (e.g., 1.0 mil) layer 65 of dielectric material such as glass. (Layer 65 covers only electrode 62 in the figures.) Optional layers 65a of highly emissive secondary electron-emitting material such as magnesium oxide cover layer 65 on electrode 62 and electrode 30 to enhance the ionization of the gas contained within channels 20. As an alternative, the entire surface of each channel 20 may be coated with a continuous thin layer of dielectric material, thereby covering both row electrodes 30 and 62.

Figure 5A:
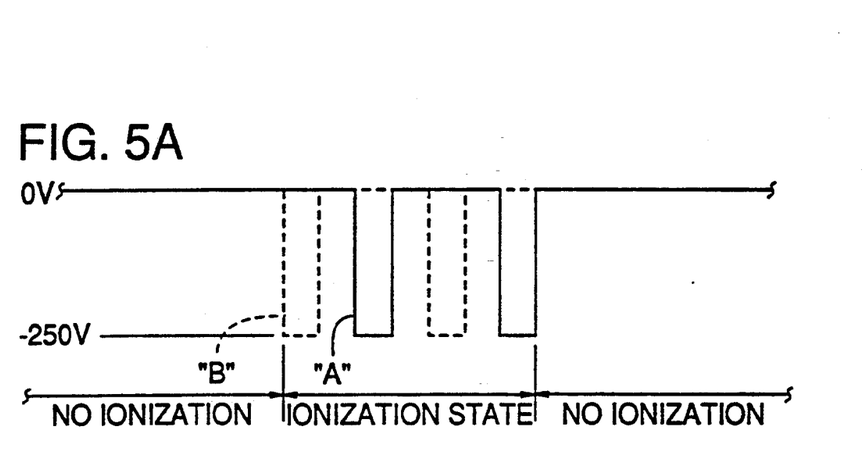
FIG. 5A shows preferred AC drive voltage waveforms A and B that effect ionization of the gas contained within the channels of the display panel of FIGS. 2-5.

FIG. 5A shows preferred AC drive voltage waveforms A and B that are applied to row electrodes 30 and 62 to effect ionization of the gas contained within channel 20. Voltage waveforms A and B applied to the respective row electrodes 30 and 62 are phase-displaced, nonoverlapping negative-going voltage pulse trains that alternate between a 0.0 volt reference and −250 volts. The preferred drive voltage arrangement ensures that at all times at least one of row electrodes 30 and 62 receives the reference voltage. Voltage waveforms A and B include negative-going pulses to ensure that the high voltage state for each of them is the same, i.e., have the same high voltage reference. The reason for using multiple pulses is that it is unlikely a single pulse could reliably sustain ionization of the ionizable gas during a row strobe. FIG. 5A shows four-two microsecond voltage pulses, three on one and two on the other of voltage waveforms A and B, during a row strobe period; and the beginning pulses of voltage waveforms A and B may be more negative than the nominal value of −250 volts to initiate the ionization process.

It would be preferable to minimize the duration of the ionization state by either narrowing the widths of the pulses or reducing their number. If one of row electrodes 30 and 62 in a channel 20 is uncoated by a dielectric layer 65 (i.e., electrode 30 in the described preferred embodiment), it is desirable that the uncoated row electrode receive the last pulse in the train of pulses effecting ionization of the gas contained within the channel. This would cause the last pulse effecting ionization to provide a direct electrical path to the reference potential upon termination of the ionization state.

The use of a dielectric layer 65 and AC voltage waveforms A and B to ionize the gas within a channel 20 is advantageous for several reasons. First, the thin dielectric layer 65 together with row electrodes 30 and 62 and column electrodes 18 form small capacitors that function to excite the ionizable gas so that a more uniform glow develops throughout a channel 20. The small capacitors stop excessive current flow in regions of nonuniformity in the distributed resistance produced by the gas contained in a channel 20 to prevent "current hogging" in such regions of nonuniformity and thereby provide the more uniform glow.

Second, the lifetime of an ionizable gas excited as described above is typically greater than that of an ionizable gas contained within a channel that does not include a dielectric material covering row electrodes 30 and 62.

Third, the use of an ionizable gas excited as described above may have a larger operating temperature range because the use of a mercury coating on the row electrodes is unneeded. Mercury is used as a coating for the row electrodes having no dielectric material covering them to prevent sputtering during excitation of the ionizable gas. Sputtering causes cathode erosion, and the use of mercury reduces this effect. At lower temperatures, however, the effectiveness of using mercury to prevent sputtering may be reduced.

It will be appreciated that, with or without the use of a continuous magnesium oxide film overlaying the dielectric-coated electrode 62, one might be able to provide a channel 20 with sufficient ionization to permit the use of a single pulse strobe drive signal. (Under such conditions only the cathode layer need be covered by the magnesium oxide film.) Such a signal would be alternately applied to electrodes 30 and 62, with the electrode not receiving the single strobe pulse being connected to the reference potential. The foregoing assumes that a single strobe pulse is sufficient to ionize the gas.

Figure 2:
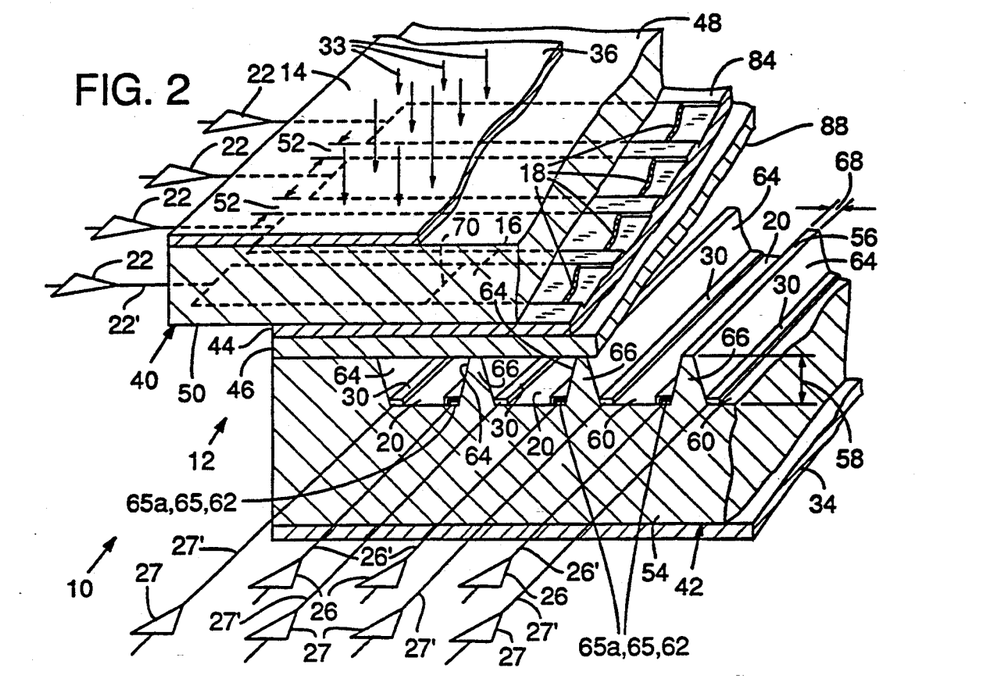
FIG. 2 is an enlarged fragmentary isometric view showing the layers of structural components forming the display panel embodying the present invention as viewed from the left side in FIG. 1.
Figure 3:
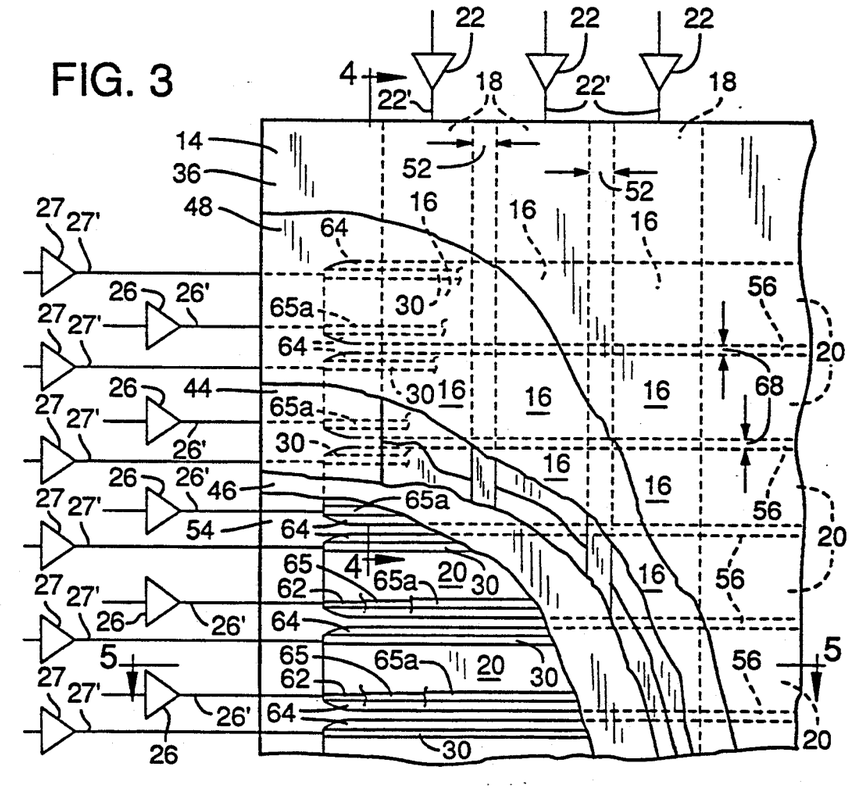
FIG. 3 is an enlarged fragmentary frontal view with portions broken away to show different depthwise views of the interior of the display panel of FIG. 2.
Figures 4, 5:
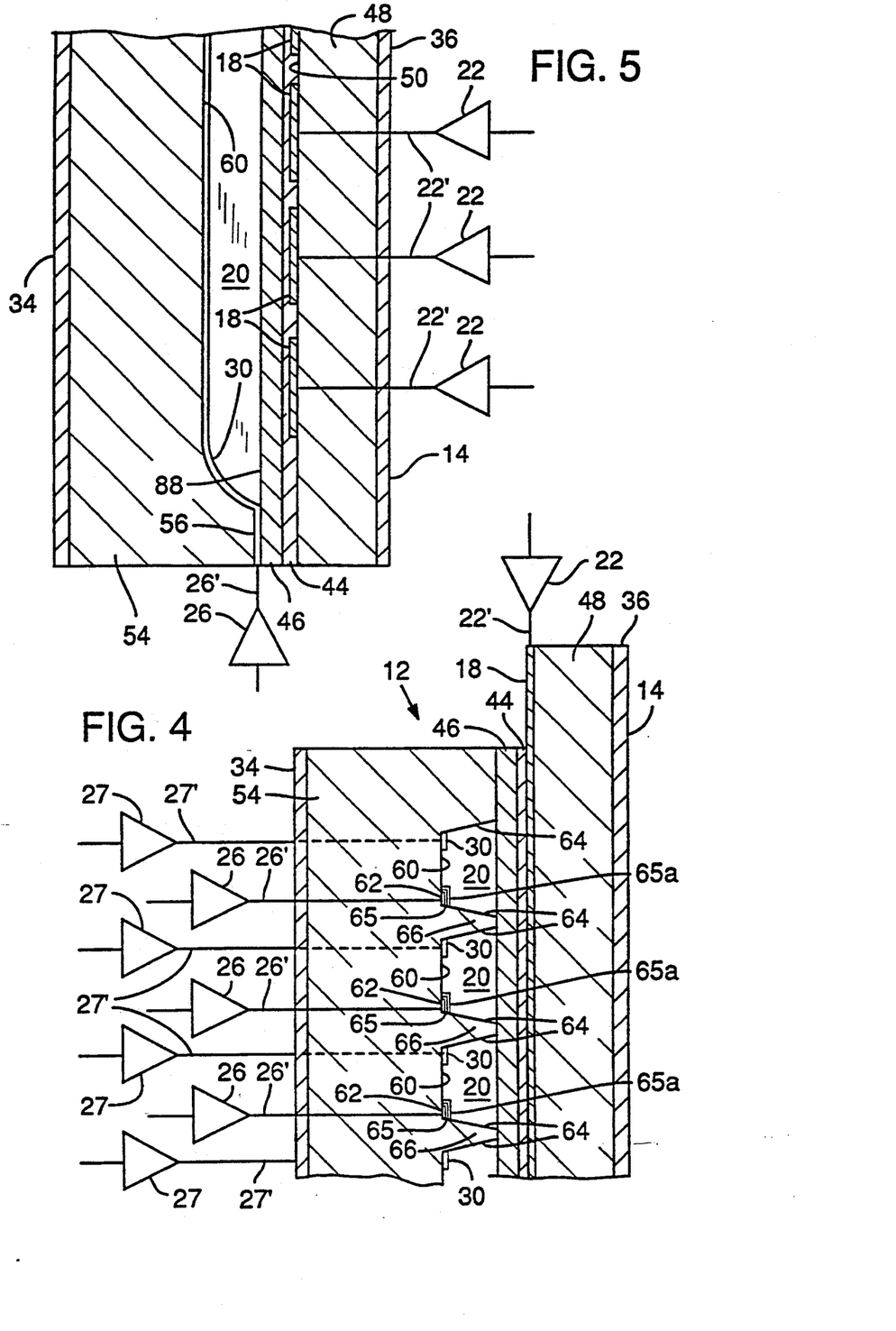
FIG. 4 is an enlarged sectional view taken along lines 4—4 of FIG. 3.
FIG. 5 is an enlarged sectional view taken along lines 5—5 of FIG. 3.

The row electrodes 30 and 62 of the channels 20 are connected to different respective ones of the output amplifiers 27 and 26 (of which several are shown in FIGS. 2 and 3) of data strobe 28. To ensure proper operation of the addressing structure, the row electrodes 30 and 62 are preferably connected to the respective outputs 27' and outputs 26' of data strobe 28 on opposite sides of display panel 10, as shown in FIG. 4.

The sidewalls 64 between adjacent channels 20 define a plurality of support structures 66 whose top surfaces 56 support layer 46 of dielectric material. Adjacent channels 20 are spaced apart by the width 68 of the top portion of each support structure 66, which width 68 defines the vertical space between next adjacent display elements 16 in a column. The overlapping regions 70 of column electrodes 18 and channels 20 define the dimensions of display element 16, which are shown in dashed lines in FIGS. 2 and 3. FIG. 3 shows with better clarity the array of display elements 16 and the vertical and horizontal spacings between them.

The magnitude of the voltage applied to column electrodes 18 specifies the distance 52 to promote isolation of adjacent column electrodes 18. Distance 52 is typically much less than the width of column electrodes 18. The inclinations of the side walls 64 between adjacent channels 20 specify the distance 68, which is typically much less than the width of channels 20. The widths of the column electrodes 18 and the channels 20 are typically the same and are a function of the desired image resolution, which is specified by the display application. It is desirable to make distances 52 and 68 as small as possible. In current models of display panel 12, the channel depth 58 is one-half the channel width.

Each of the channels 20 is filled with an ionizable gas, preferably one that includes helium, for reasons that will be explained below. Layer 46 of dielectric material functions as an isolating barrier between the ionizable gas contained within channel 20 and layer 44 of liquid crystal material, however. The absence of dielectric layer 46 would permit either the liquid crystal material to flow into the channel 20 or the ionizable gas to contaminate the liquid crystal material. Dielectric layer 46 may be eliminated from displays that employ a solid or encapsulated electro-optic material, however.

Figure 6:
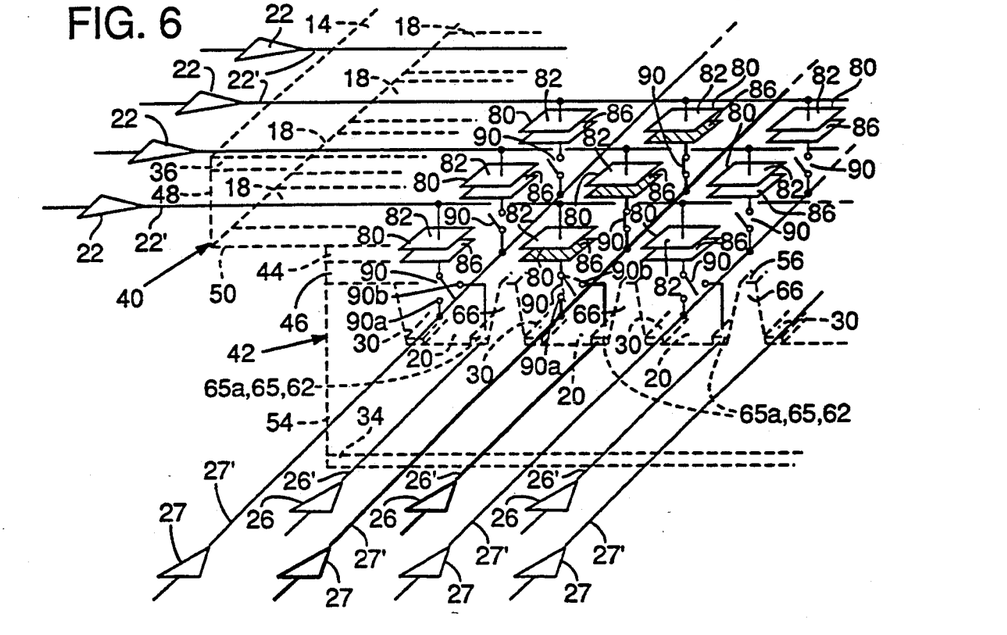
FIG. 6 is an equivalent circuit showing for a display system the operation of the plasma as a switch for an exemplary row receiving a data strobe pulse and three exemplary data columns receiving a data drive signal.

The principles underlying the operation of display panel 12 are that 1) each of its display elements 16 functions as a sampling capacitor for analog voltage data applied to the column electrode 18 forming a part of the display element and 2) the ionizable gas functions as a sampling switch. FIG. 6 is an equivalent circuit to which the following explanation of the operation of display system 10 refers.

With reference to FIG. 6, each of display elements 16 of display panel 12 can be modeled as a capacitor 80

(hereinafter "capacitor model 80"), whose top plate 82 represents one of the column electrodes 18 (FIG. 2) and whose bottom plate 86 represents the free surface 88 (FIG. 2) of layer 46 of the dielectric material. Capacitor model 80 represents the capacitive liquid crystal cell formed by an overlapping region of a column electrode 18 and a channel 20. The description herein of the operation of display system 10 refers to the capacitor model 80.

In accordance with the basic addressing procedure, data driver 24 captures a first line of data, which represents discrete samples of the time-varying voltage of analog data signal in a time interval of predetermined duration. The sample of the magnitude of the data signal at a particular instance within the time interval represents the magnitude of the analog voltage applied to a capacitor model 80 in a corresponding column position of the row electrodes 30 and 62 receiving strobe pulses. Data driver 24 develops on its output conductors 22' the analog voltages that are applied to column electrode 18. In FIG. 6, four exemplary output amplifiers 22 of data driver 24 deliver analog voltages of a positive polarity with respect to the electrical reference potential (i.e., 0.0 volt as indicated in FIG. 5A) to the respective ones of column electrodes 18 to which they are connected. The application of a positive voltage on a column electrode 18 induces on free surface 88 (FIG. 2) of layer 46 of the dielectric material a voltage that is essentially equal to the magnitude of the applied voltage. This causes no change in the potential difference across capacitor model 80 and is represented in FIG. 6 by a top plate 82 and a bottom plate 86 with white surfaces.

In this instance, the gas contained in a channel 20 is in a nonionized state, and the analog voltage developed on plates 82 and 86 of capacitor model 80 is positive with respect to the voltage potential of row electrodes 30 and 62 in the channel. Whenever data strobe 28 develops the phase-displaced, negative-going AC voltage pulse waveforms A and B on the respective row electrodes 30 and 62 positioned within a channel 20, the gas in the channel assumes an ionized state (i.e., becomes a plasma). The channel 20 whose row electrodes receive the strobe pulse waveforms A and B is represented in FIG. 6 in dark, thick lines. Under these conditions, the row electrodes 30 and 62 function alternately as an anode and a cathode for the plasma contained within the channel.

The electrons in the plasma neutralize the induced positive voltage on the bottom plates 86 of capacitor models 80. The capacitor models 80 in the strobed row are charged with the data voltages applied across them. This condition is indicated in FIG. 6 by top plates 82 with white surfaces and bottom plates 86 with lined surfaces. Upon completion of the storage of the data voltages across capacitor models 80, data strobe 28 terminates the negative-going voltage pulses of waveforms A and B on the row electrodes 30 and 62 of the strobed channel 20, thereby ending the strobe pulse and extinguishing the plasma.

Each of the pairs of row electrodes 30 and 62 of a channel 20 is strobed in a similar manner until the entire display surface 14 is completely addressed and thereby stores an image field of data. The voltage remains stored across each of the capacitor models 80 in the strobed row for a time at least as long as the duration of the image field and is independent of subsequent changes in data voltage applied to top plate 82 of capacitor model 80. The voltage stored across each of the capacitor models 80 changes in accordance with the analog data voltages representing the display data of the next succeeding image field.

In a display system 10 whose image fields are in a noninterlaced format, the analog data voltages applied to column electrodes 18 in the next succeeding image field are of opposite polarities. Alternating between positive and negative polarities from one image field to the next image field provides a long term zero net DC voltage component, which is typically required for long term operation of liquid crystal materials. The liquid crystal material produces the gray scale effect in response to the root-mean-square (rms) value of the applied analog voltage data. The display image produces is, therefore, unaffected by alternate changes in polarity of the analog voltage data. In a display system 10 whose image fields are in an interlaced format, the analog data voltages applied to column 18 electrodes in next succeeding image fields are of opposite polarity to achieve the long term zero net DC voltage component. Each image frame includes two image fields of which each comprises one-half the number of addressable lines.

The description presented above indicates that the ionizable gas contained within each of the channels 20 operates as an electrical switch 90 whose contact position changes among three switching states as a function of the voltage applied by data strobe 28. The switches 90 shown in FIG. 6 in the open position are disconnected from row electrodes 30 and 62, which are not driven by strobe pulses. The absence of a strobe pulse allows the gas within the channels 20 to be in a nonionized state and thereby be in a nonconducting state. The switches 90 shown in FIG. 6 in the closed position are alternately connected between a pole 90a of row electrode 30 and a pole 90b of row electrode 62 in accordance with strobe pulse A and B (FIG. 5A) applied to the respective row electrodes 30 and 62. The AC pulses of waveforms A and B are of magnitudes that cause the gas within the channel 20 to be in an ionized state and thereby be in a conducting state. For example, when waveforms A and B are at 0.0 volt and −250 volts, respectively, switch 90 is connected to pole 90a. Similarly, when waveforms A and B are at −250 volts and 0.0 volt, respectively, switch 90 is connected to pole 90b. In FIG. 6, the set of amplifiers 26 and 27 shown in the middle of the three sets of output amplifiers 26 and 27 of data strobe 28 strobe a row of capacitor models 80 to establish and store the display data voltages across them.

To function as a switch, the ionizable gas contained within channels 20 beneath electrode structure 40 communicates with layer 46 of the dielectric material to provide an electrically conductive path from layer 46 of the material to electrode layer 65 of dielectric material covering the reference (i.e., the one of row electrodes 30 and 62 receiving the reference voltage level at a particular time). The plasma in a channel 20 whose row electrodes receive strobe pulses provides an "AC ground path" to the capacitor model 80 representing the portion of liquid crystal material positioned adjacent the plasma. This allows the capacitor models 80 to sample the analog data voltages applied to column electrodes 18. Extinguishing the plasma acts to remove the conducting path, thereby allowing the data sample to be held across the display element. The voltages remain stored across layer 44 of the liquid crystal material until voltages representing a new line of data in a subsequent image field are developed across the layer 44. The above-described addressing structure and technique provide signals of essentially 100% duty cycle to every one of the display elements 16.

Figure 7:
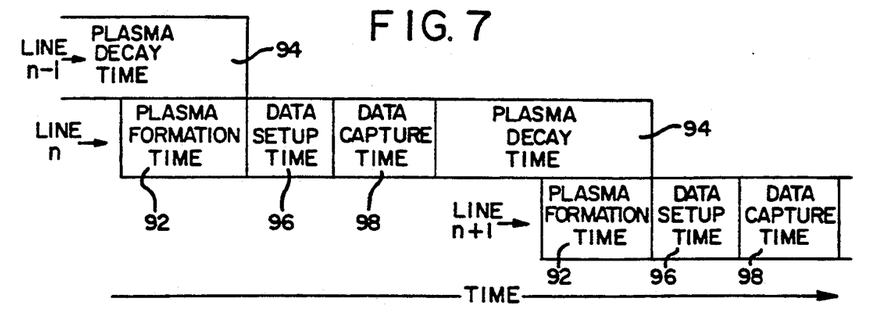
FIG. 7 is a diagram showing the various time constraints that determine the maximum number of lines of data that are addressable by a display system embodying the present invention.

FIG. 7 is a diagram showing the time constraints that limit the number of lines of data of which display system 10 is capable of addressing during an image field. With reference to FIG. 7, as exemplary line "n" of data requires time 92 for the plasma to form after the row electrodes 30 and 62 of the strobed channel 20 receive strobe pulses. The plasma formation time 92 may be substantially eliminated as a factor in limiting the number of addressable lines in an image field by initiating the strobe pulse in advance during the preceding line n-1. In a preferred embodiment, the plasma formation time 92 for helium gas is nominally 1.0 microsecond.

The data setup time 96 represents the time during which data driver 24 slews between the data values of two next adjacent lines of data and develops on output amplifiers 22 the analog voltage signals that are applied to column electrodes 18. The data setup time 96 is a function of the electronic circuitry used to implement data driver 24. A data setup time 96 of less than 1.0 microsecond is achievable.

Figure 8:
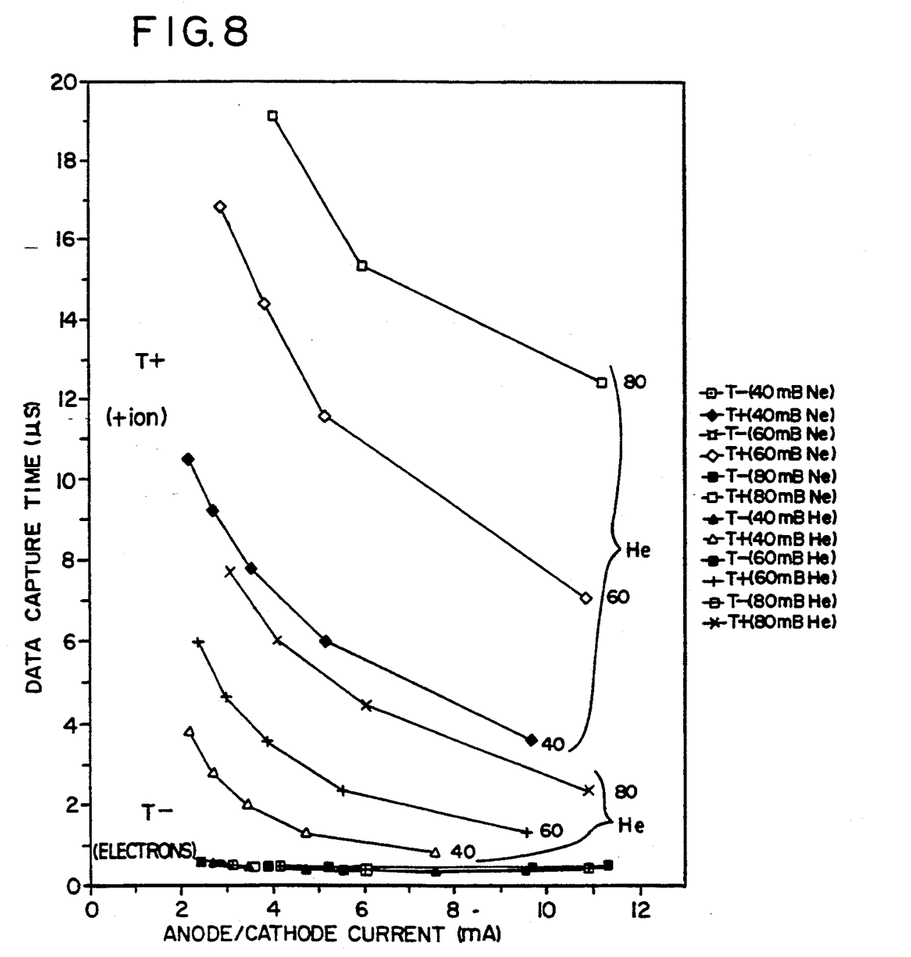
FIG. 8 is a graph showing the comparative relationship of the data capture times of neon gas and helium gas as a function of the current flowing between the electrodes positioned within the channels of the display panel of FIGS. 2-5.

The data capture time 98 depends on the conductivity of the ionizable gas contained within the channels 20. FIG. 8 is a graph showing the time for data capture 98 as a function of the plasma current flowing at any instant between the reference row electrode (i.e., receiving a 0.0 volt signal) and the strobe row electrode (i.e., receiving on AC strobe pulse) in a channel 20. The curves in FIG. 8 represent the time required by a display element to acquire 90% of the voltage corresponding to a datum. FIG. 8 shows that the ions produced by a plasma comprised of helium gas exhibit a lower data capture time 98 than that of neon. The electron current in a plasma flows from the cathode to the anode, i.e., alternately between row electrodes 30 and 62.

A preferred operating point is that which provides the fastest data capture time 98 for positive ion current. In the particular case represented in FIG. 8, such an operating point can be achieved by using helium gas at a pressure of 40 millibars and a current of 7.5 milliamperes to produce a time 98 for data capture of about 0.5 microsecond. The reason helium provides a shorter data capture time 98 than that of neon is that helium is a lighter ion with greater mobility. Optimum values of pressure and current depend on the size and shape of channels 20.

Figure 9:
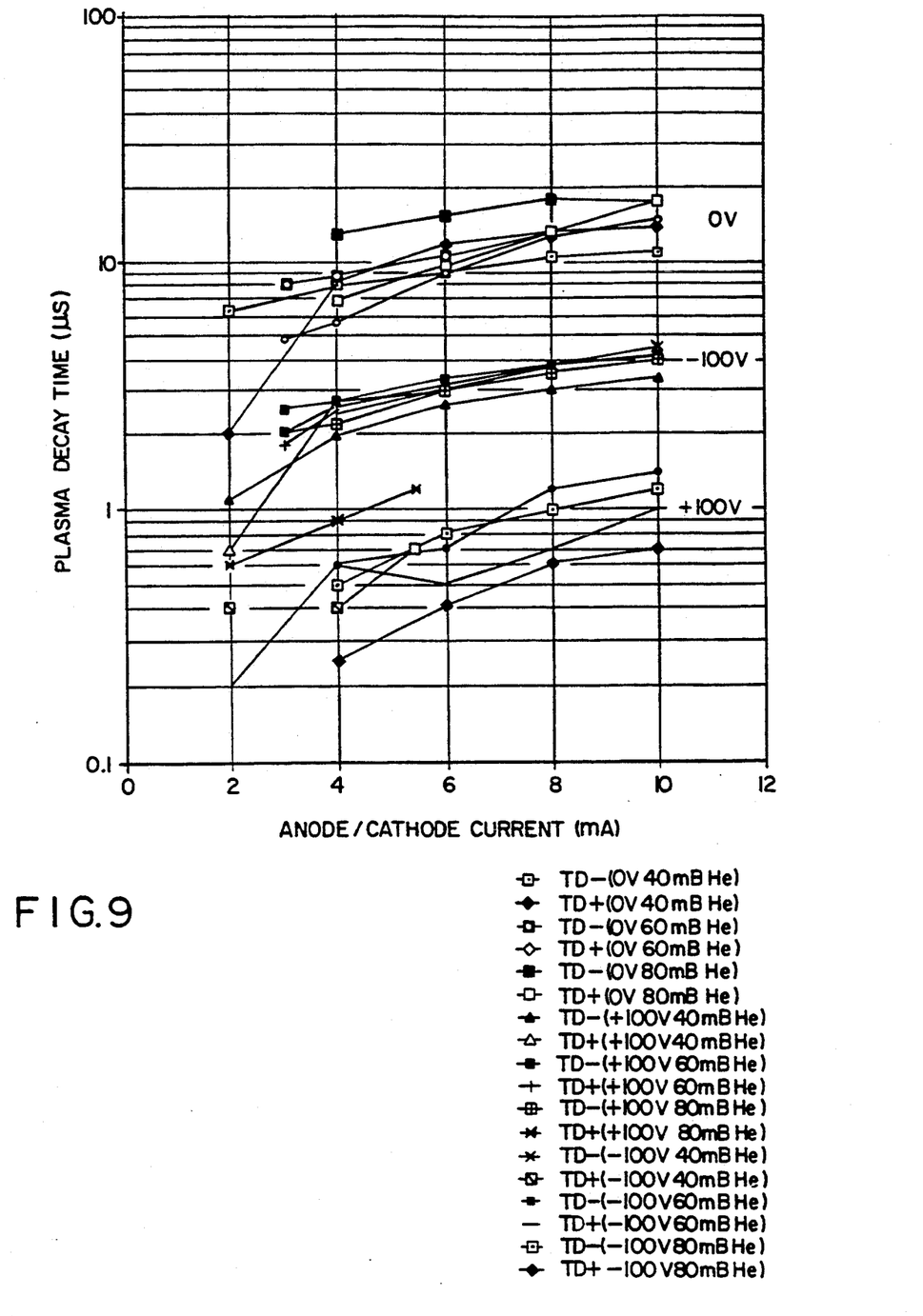
FIG. 9 is a graph showing the data strobe pulses of different magnitudes the plasma decay times for helium gas as a function of the current that was flowing during the strobe pulse between the electrodes positioned within the channels of the display panel of FIGS. 2-5.

The plasma decay time 94 represents the time during which the plasma in channel 20 returns to a nonionized state upon the removal of a strobe pulse from row electrode 62. FIG. 9 is a graph showing the plasma decay time beyond which no greater than 3% crosstalk will occur as a function of anode/cathode current in display panel 12. FIG. 9 shows that the plasma decay time 94 increases as a function of the current flowing through the plasma. The magnitude of the strobe pulses applied to row electrodes 30 and 62 determines the amount of current flowing through the plasma. FIG. 9 indicates that decreased plasma decay times 94 can be achieved by applying a continuous bias voltage of about +100 volts, which is less than the voltage required to maintain the helium gas in its ionized state. FIG. 9 also indicates that a bias voltage of +100 volts would provide approximately a tenfold decrease in plasma decay time 94 relative to a bias voltage of zero volts.

The time required to address a line of data equals the sum of the data setup time 96, the data capture time 98, and the plasma decay time 94. The number of lines addressable during an image field equals the time duration of the image field divided by the time required to address a line of data. For noninterlaced 60 Hz frame rate applications, the number of lines of data display system 10 would appear to be capable of addressing exceeds 9,000 lines using the above-described simple addressing technique. It will be appreciated that the number of addressable lines of data is not the same as the resolution of display system 10. The resolution is a function of the widths of the channels 20 and the widths of the column electrodes 18.

The use of a priming technique is advantageous to ensure the ability to address a relatively large number of lines in an image frame. Priming entails the introduction of ions to initiate a gas discharge. Priming of display system 10 can be accomplished by passing a current through a priming channel (not shown) which is orthogonally disposed to the channels 20 and in which each of the channels 20 terminates along one of the margins of display panel 12. Priming allows plasma formation without an initial statistical decay time that would otherwise unpredictably lengthen the plasma formation time.

Figure 10A:
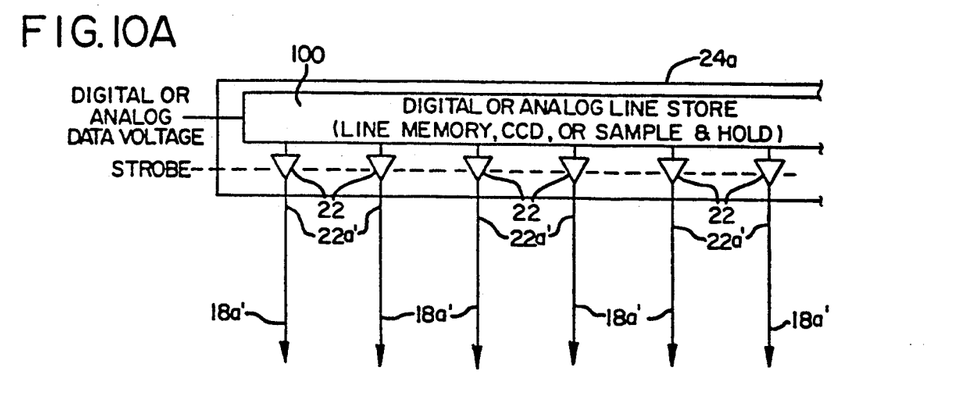
FIGS. 10A and 10B are diagrams of alternative electronic circuit designs of the data driver shown in FIG. 1.
Figure 10B:
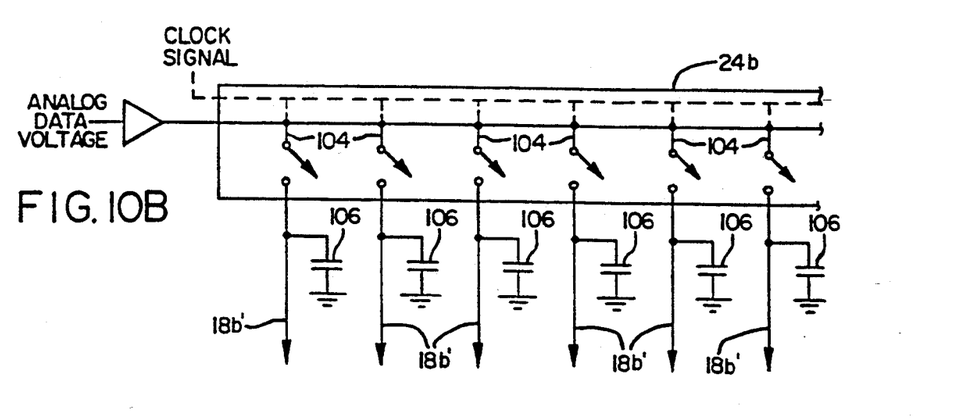

FIGS. 10A and 10B show alternate circuit designs for the data drivers 24 whose corresponding components are identified by identical reference numerals with the suffixes "a" and "b", respectively.

With reference to FIG. 10A, data driver 24a samples the data signal and stores it in a buffer memory or line store 100. The data signal can be in analog or digital form. Buffer memory 100 can be of the charge-coupled device (CCD) type or the sample-and-hold type to store an analog data signal, or buffer memory 100 can be of the digital type to store a digital data signal. The devices 22 represent either buffer amplifiers or digital-to-analog converters, depending on whether buffer memory 100 holds analog voltages or digital data, respectively. Devices 22 permit the parallel transfer of analog voltages to column electrodes 18a. Data driver 24a is capable of high-speed operation because CCD and sample-and-hold circuits are capable of high-speed acquisition and the analog voltages can be transferred simultaneously in parallel to the column electrodes 18a.

With reference to FIG. 10B, data driver 24b samples the analog data signal in serial fashion by sequentially closing and opening one at a time different ones of a set of switches 104. Each of the switches 104 is connected to a corresponding capacitor 106. The capacitors 106 accumulate charge from the data signal when the switch is closed. This provides analog voltage samples of the data signal to the column electrodes 18b in a row from one end to the other end. A sampling clock signal applied to the control electrodes of switches 104 sets the sampling rate. The data setup time 96 of the circuit of FIG. 10B is greater than that of the circuit of FIG. 10A by a multiplication factor equal to the number of column electrodes 18b.

To operate properly in display system 10, data driver 24b requires that the horizontal blanking time from row to row exceed the sum of the data capture time 98 and the plasma decay time 94.

The addressing structure of the present invention is also amenable to the reduction of the number of drivers through the use of other techniques similar to the technique implemented in the Self-Scan ™ displays developed by Burroughs. Such displays employ a display cell, which the viewer sees, and a scan cell, which the viewer does not see. The scan cells control the state of the display cells by sending active priming particles into a localized region of an ionizable gas. In a scan cell channel, a plasma discharge is moved sequentially adjacent each display cell and generates priming particles which activate the display cell adjacent to them.

In display panel 12, electrical segmentation of the orthogonal priming channel could provide a localized ion source that moves sequentially from one channel to the next. In lieu of the above-described technique, wall charge coupling or other known techniques could be employed to implement further driver reduction.

It will be obvious to those having ordinary skill in the art that many changes may be made to the details of the above-described preferred embodiment of the present invention without departing from the underlying principles thereof. The scope of the present invention should be determined, therefore, only by the following claims.

I claim:

1. An addressing structure for an analog data storage element, comprising:

an ionizable gaseous medium in communication with an electrical reference and an analog data storage element having a data electrode for receiving an analog datum; and ionizing means including two spaced-apart, electrodes adapted to receive signals for selectively effecting ionization of the ionizable gaseous medium to provide an interruptible electrical connection between the data storage element and the electrical reference, at least one of the two electrodes being coated with a dielectric material, thereby to selectively address and apply the analog datum to the analog data storage element.

2. The addressing structure of claim 1 in which the data storage element comprises a data electrode for transmitting variable value data signals and a layer of dielectric material having first and second major surfaces, the first major surface communicating with the data electrode and the second major surface communicating with the ionizable gaseous medium.

3. The addressing structure of claim 2 in which a layer of material having electro-optic properties is disposed between the data electrode and the first major surface of the layer of dielectric material so that a property of the layer of electro-optic material changes in response to a data signal appearing on the data electrode.

4. The addressing structure of claim 1 in which one of the two electrodes functions as an anode and the other functions as a cathode, and further comprising a film of highly emissive secondary electron emissive material that covers the electrode functioning as the cathode.

5. The addressing structure of claim 4 in which the electrodes receive phase-disposed AC pulse signals and in which a film of highly emissive secondary electron emissive material covers each of the electrodes.

6. The addressing structure of claim 1 in which the signals include a pair of phase-disposed AC pulse signal waveforms.

7. The addressing structure of claim 1 in which the ionizable gaseous medium is contained in an enclosed volume and the dielectric-coated electrode is positioned within the enclosed volume.

* * * * *

UNITED STATES PATENT AND TRADEMARK OFFICE
CERTIFICATE OF CORRECTION

PATENT NO. : 5,272,472
DATED : December 21, 1993
INVENTOR(S) : Thomas S. Buzak It is certified that error appears in the above-identified patent and that said Letters Patent is hereby corrected as shown below:

Col. 14, claim 5, line 23, "phase-disposed" should be "phase-displaced".

Col. 14, claim 6, line 27, "phase-disposed" should be "phase-displaced".

Signed and Sealed this

Twenty-sixth Day of July, 1994

Attest:

BRUCE LEHMAN

*Attesting Officer*       *Commissioner of Patents and Trademarks*